United States Patent [19]
LeBlanc et al.

[11] Patent Number: 6,055,653
[45] Date of Patent: Apr. 25, 2000

[54] METHOD AND APPARATUS FOR TESTING GANG MEMORY MODULES

[75] Inventors: Michael LeBlanc, Austin; Davoud Safari, Round Rock; Edwin Smith, Leander, all of Tex.

[73] Assignee: Compaq Computer Corporation, Houston, Tex.

[21] Appl. No.: 09/067,177

[22] Filed: Apr. 27, 1998

[51] Int. Cl.[7] .................................................. G11C 29/00
[52] U.S. Cl. ........................ 714/718; 714/717; 714/719; 365/200; 365/201
[58] Field of Search ................................... 714/719, 718, 714/717; 365/200, 201

[56] References Cited

U.S. PATENT DOCUMENTS 4,992,850  2/1991  Corbett et al. .............................. 357/72
5,961,657  10/1999  Park et al. ................................ 714/718

OTHER PUBLICATIONS

Book: "Sigma Memory Tester: User's Guide Version 2.17," copyright 1992–1994 by Dark Horse Systems Incorporated.

Primary Examiner—Albert De Cady
Assistant Examiner—Rudolph Hastick
Attorney, Agent, or Firm—Fenwick & West LLP

[57] ABSTRACT

The gangSIMM Memory Tester is a PWA which plugs directly into a CPU's SIMM slot. The gangSIMM Memory Tester contains a known good SIMM, which is connected directly to the CPU's bus. All memory functions for this SIMM slot is provided by the gold SIMM per normal SIMM operation. The CPU bus routed to the gold SIMM on the gangSIMM Memory Tester is also routed to a test bus via a buffer which provides increased drive capacity. The test bus is distributed in parallel to N number of SIMM slots located on the gangSIMM Memory Tester throughout a second set of tri-stating buffers. During read accesses to memory involving the CPUs SIMM slot location where the gang-SIMM PWA is directly plugged into, data provided by the gold SIMM is compared on an individual basis with the data provided by an under-test SIMM. This operation occurs in-parallel for all under-test SIMMs.

20 Claims, 10 Drawing Sheets

METHOD AND APPARATUS FOR TESTING GANG MEMORY MODULES

TECHNICAL FIELD OF THE INVENTION

This invention relates generally to a method and apparatus for performing memory module testing, and more specifically, to a method and apparatus for performing memory test suites in parallel on a plurality of memory modules connected directly to an extension of a system's memory bus.

BACKGROUND OF THE INVENTION

Testing memory modules such as single in-line memory modules (SIMMs) or double in-line memory modules (DIMMs) has become particularly important in a number of key applications. For instance, manufacturers of computer systems perform memory test suites to ensure installed memory will not fail when called upon to perform. One of ordinary skill will recognize that the term SIMM when used throughout this application similarly applies to and includes DIMMs.

Typical of conventional methods and apparatus for testing memory modules is the use of a test suite to test memory modules mounted on a CPU board. FIG. 1 shows a typical CPU board 104 included within a computer system 100. Computer System 100 generally includes a computer readable medium device 138 that reads and writes to a computer readable medium 140. Computer system 100 also includes an input device 142 and a display device 144 coupled to a CPU board 104 by a bus 143. CPU board 104 generally includes a processor 102, a memory bus 105 and a memory 103. As shown, memory 103 includes SIMM1 through SIMM 8 (106, 110, 114, 118, 122, 126, 130 and 134), where each SIMM is connected to memory bus 105 and is mounted to CPU board 104 via respective SIMM slot (146, 148, 150, 152, 154, 156, 158 and 160). Each SIMM accommodates surface mounted memory chips, such as DRAMs. For instance, SIMM1 106, through SIMM8 134, respectively, include a set of memory chips(108, 112, 116, 120, 124, 128, 132 and 136). As shown in FIG. 1, each set of memory chips preferably includes 18 memory chips. One of ordinary skill in the art will recognize that the number of memory chips installed on a given SIMM may vary depending upon a system's overall memory requirements and preferred system configuration.

Although conventional SIMM memory testing methods performed for example by memory test suite 109 have the ability to test SIMMs in parallel, each test can only accommodate the number of SIMMs mounted upon a particular CPU board. For example, since a typical CPU board 104 as shown in FIG. 1 includes 8 SIMMs (106, 110, 114, 118, 122, 126, 130, 134), not more than eight SIMMs can be tested in parallel at a given time. This limitation is particularly troublesome given the rapid increase in the amount of memory installed on new computer systems. Furthermore, because of this limitation, conventional memory testing systems do not provide a capacity for testing SIMM memory that meets the needs of users, such as computer system manufacturers.

New products such as computer systems that require memory and upgrades to current products continue to place more memory within these systems. Accordingly, the time required to test memory continues to increase. For example, the time needed to test increasingly larger memory units such as DRAMs that are installed on new products rise at a rate in excess of a linear function of the memory increase. For instance, as larger DRAMs are introduced into new products, the test time increase includes an additional 20% overhead on a mbyte/minute basis.

Also typical of conventional methods and apparatus for testing SIMMs is the immediate termination of testing when a first SIMM fails. For instance, if during conventional memory testing SIMM1 106 fails, testing immediately terminates without testing the remaining SIMMs. Therefore, re-executing memory testing is necessary to ensure errors are not present in the other SIMMs, including SIMM2 through SIMM 8 (110, 114, 118, 122, 126, 130 and 134). Because testing CPU board 104 with a conventional SIMM testing system could ultimately require numerous executions, such a conventional system unnecessarily wastes time and resources.

Conventional SIMM testing systems also do not include indicators that identify which memory chips are bad. For example, a conventional testing system for testing each of the eight SIMMs (106, 110, 114, 118, 122, 126, 130, 134) shown in FIG. 1, identifies which SIMMs are bad, but does not identify the specific memory chip(s) that caused the SIMM to fail. For instance, if during testing SIMM1 106 where to fail, a conventional SIMM testing system would not identify which of the eighteen memory chips 108, (e.g., DRAMs) are bad. Because of this limitation, when a SIMM failure occurs, conventional SIMM testing systems require a technician to review memory testing diagrams in order to debug which of the DRAMS led to the SIMM failure, thereby resulting in unnecessarily high debugging costs due in part to the expense of the technician's time on a problem that could otherwise be used in a more productive manner.

As a result, there has been a longfelt need for a SIMM testing system that performs parallel testing of a greater number of SIMMs than the number of SIMMs generally mountable on a CPU board, continues memory testing after a SIMM fails, and identifies the specific memory unit of a SIMM that is bad—requirements never previously met by conventional SIMM testing systems.

SUMMARY OF THE INVENTION

The gangSIMM Memory Tester of the present invention is a "Printed Wiring Assembly" (PWA) which plugs directly into a CPU's SIMM slot. The gangSIMM Memory Tester contains a known good SIMM, hereafter referred to as the "gold SIMM" which is connected directly to the CPU's bus. All memory functions for this SIMM slot are provided by the gold SIMM per normal SIMM operation. The CPU bus routed to the gold SIMM on the gangSIMM Memory Tester is also routed to a test bus via a buffer which provides increased drive capacity. The test bus is distributed in parallel to N number of SIMM slots (where N is an arbitrarily large number) located on the gangSIMM Memory Tester throughout a second set of tri-stating buffers. During read accesses to memory involving the CPU's SIMM slot location where the gangSIMM PWA is directly plugged into, data provided by the gold SIMM is compared on an individual basis to the data provided by an under-test SIMM. This operation occurs in-parallel for all under-test SIMMs.

The comparison logic displays an error message such as an LED being lit whenever the two sets of data are different. By comparing data on a bit by bit basis, errors down to the DRAM location can be determined. Many different methods may be used to display the error message, however, in a preferred embodiment, LEDs are used. Once an error is encountered during gangSIMM testing, the error message latches permanently until a test reset occurs. The latching allows for testing to continue uninterrupted until all testing has been completed on all under-test SIMMs. Therefore, the Gang Memory SIMM tester not only detects a fault but it also determines the failing DRAM, thereby eliminating time previously spent debugging DRAM failures.

With the gangSIMM memory tester of the present invention, any test suite executable on SIMMs under test can be directly executed on N number of SIMMs. These suites can include memory diagnostics developed in-house, provided by third-party vendors, or provided by normal system execution. By increasing the number of SIMMs being tested by N for each SIMM slot, the average test time per SIMM is decreased by a factor of N since no additional test time is required for each additional SIMM. The significance of a 1/N reduction in test time for a high-volume item like SIMMs can lead to significant reductions in costs associated with SIMM testing in a manufacturing environment. This advantage becomes even greater when the trend for larger capacity SIMMs is taken into account.

The invention may be better appreciated from the following figures, taken together with the accompanying Detailed Description of the Invention.

DESCRIPTION OF THE PREFERRED EMBODIMENTS

The following description is of the best presently contemplated mode of carrying out the invention. The description is made for the purpose of illustrating the general principles of the invention and is not to be taken in a limiting sense. As previously discussed, the term SIMM in the present invention refers to both SIMMs and DIMMs.

Figure 2A:
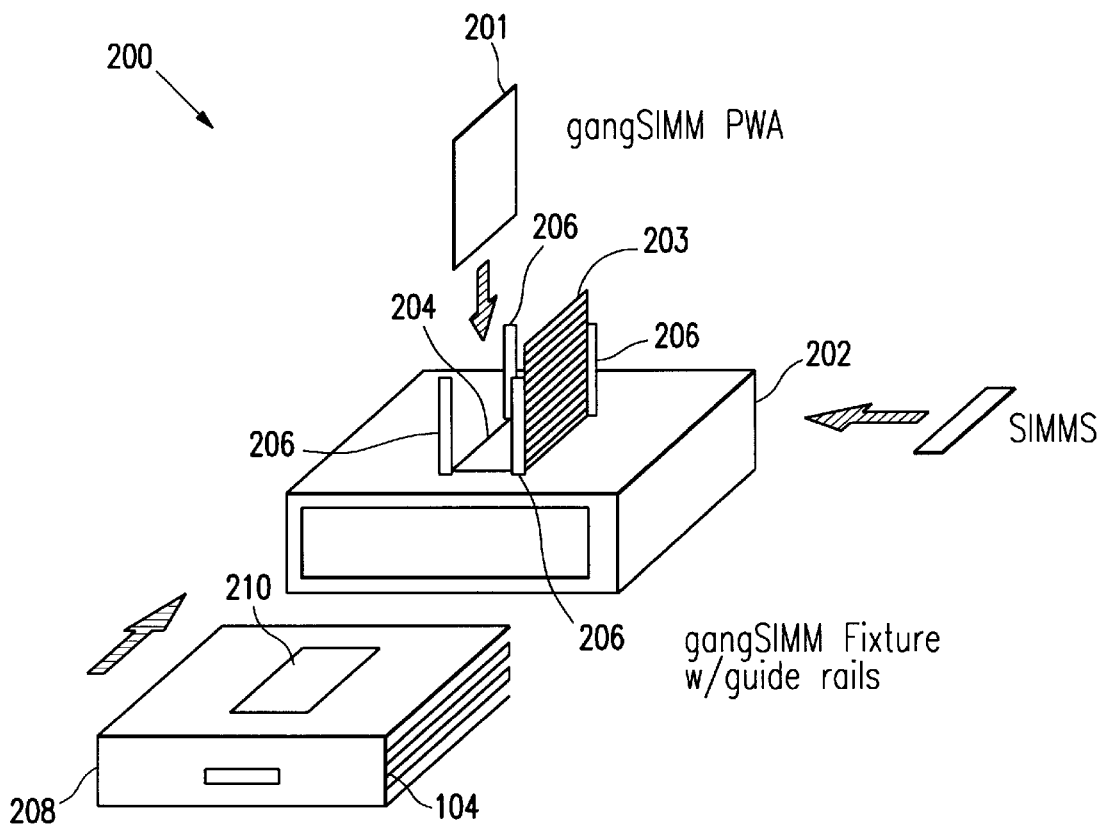
FIG. 2A shows the gangSIMM PWA in a position to be plugged into the gangSIMM memory tester system in accordance with the present invention.

Referring first to FIG. 2A, a gangSIMM PWA 201 in a position for insertion into gangSIMM memory testing system 200 may be generally appreciated. More particularly FIG. 2A shows a gangSIMM PWA 201 being lowered through an opening 204 of a computer enclosure 202 to be plugged directly into a SIMM slot 146 of CPU board 104 (not shown). A customer replaceable unit (CRU) computer system 208 having an opening 210 and comprising a CPU board 104 that includes SIMM slot 146, and a power unit and an input/output motherboard (not shown) is being inserted into computer enclosure 202.

One of ordinary skill in the art will recognize that CRU computer system 208 is inserted into computer enclosure 202 prior to the lowering of gangSIMM PWA 201 for insertion into SIMM slot 146 of CPU board 104. More particularly, gangSIMM PWA 201 is inserted along rails 206 through opening 204 of computer enclosure 202, and through opening 210 of CRU computer system 208 for direct insertion into SIMM slot 146 of CPU circuit board 104.

Figure 2B:
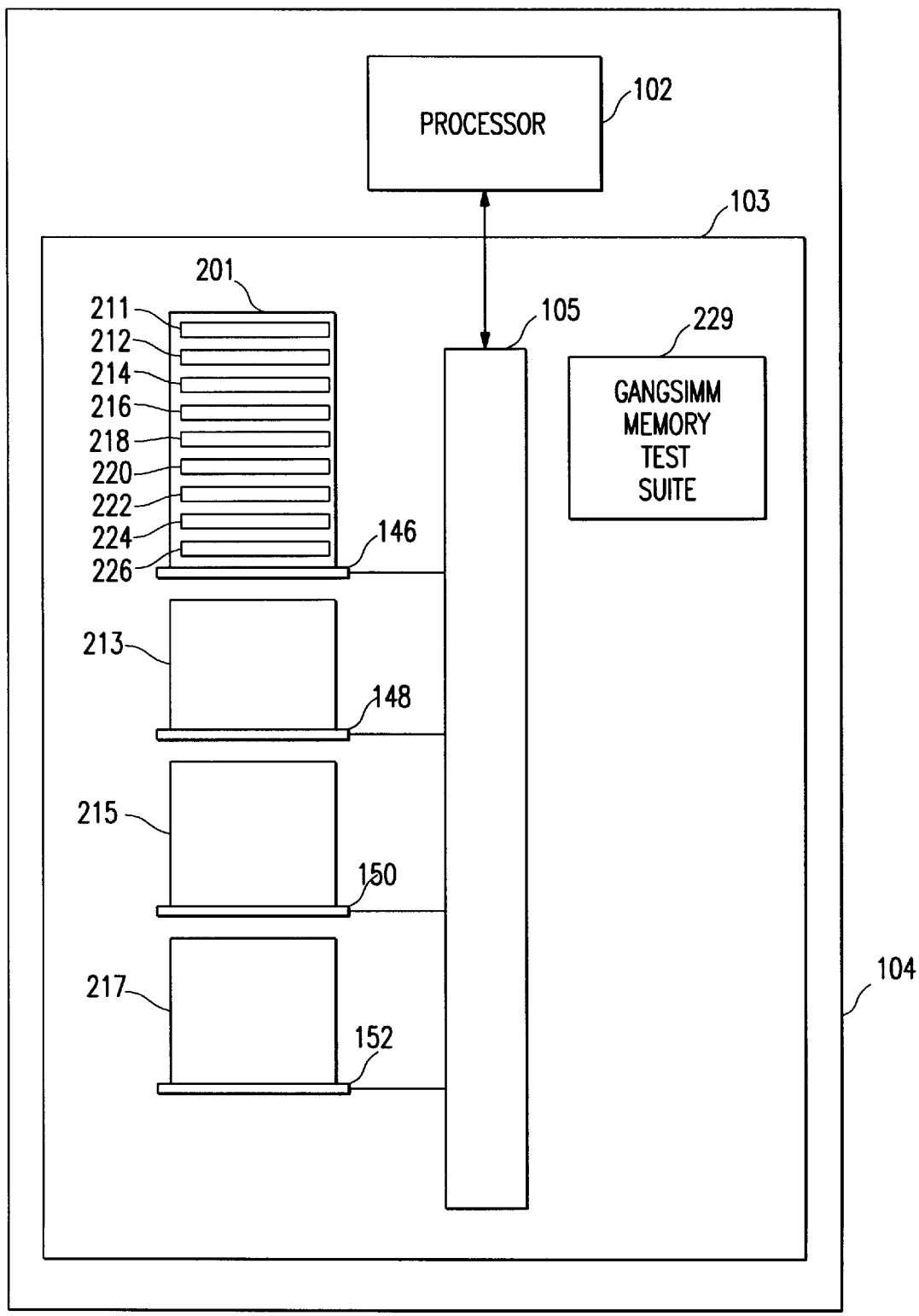
FIG. 2B shows a diagram of a gangSIMM PWA plugged into a SIMM slot of a CPU board in accordance with the present invention.

Referring next to FIG. 2B, the insertion of each one of four gangSIMM PWAs into a separate SIMM slot of CPU circuit board 104 may be appreciated. In particular, the described embodiment of FIG. 2B shows in memory 103 gangSIMM PWAs (201, 213, 215, 217) directly inserted into respective slots (146, 148, 150, 152), and test suite 229. One of ordinary skill in the art will recognize that gangSIMM PWAs (201, 213, 215, 217) and test suite 229 are respectively hardware and software. As shown, gangSIMM PWA 201 includes nine SIMM slots (211, 212, 214, 216, 218, 220, 222, 224, 226), where one slot is used to provide the SIMM testing standard, referred to as a gold SIMM 226, and the other eight slots (211, 212, 214, 216, 218, 220, 222 and 224) are used for testing SIMMs.

If an additional gangSIMM PWA including slots to test 8 SIMMs is inserted into each of four SIMM slots on CPU board 104, a total of 32 SIMMs may be tested in parallel. It will be appreciated that the gangSIMM PWA of the present invention, in contrast to conventional SIMM testing systems, greatly increases the number of SIMMs that may be tested in parallel. It will be further appreciated that in the embodiment of the present invention shown in FIG. 2B only four SIMM slots of the CPU board are used to test a total of 32 SIMMs. Hence, one of ordinary skill in the art will recognize that in contrast to conventional SIMM testing systems, the gangSIMM PWA of the present invention significantly reduces per unit test time for testing and verifying the condition of each SIMM. It will be appreciated that test suite 209 can be over-the-counter, customized, or a simple provider of random test data. Furthermore, execution of only an operating system would still cause memory cross checking of gangSIMM PWA 201 to occur. Test suite 209 may include diagnostics functions when used in a manufacturing environment. However, gangSIMM PWA 201 will test a plurality of SIMMs regardless of the type or quantity of SIMM testing.

More particularly, one of ordinary skill in the art will recognize that reduced test time is attributed in part to using less SIMM slots on a CPU board to test more SIMMs than that of conventional SIMM testing systems. With the gangSIMM memory tester of the present invention, execution of test suite 229 tests N number of SIMMs. By increasing the number of SIMMs being tested by N for each SIMM slot, the average test time per SIMM is decreased by a factor of N since no additional test time is required to test each additional SIMM. The significance of a 1/N reduction in test time for a high-volume item like SIMMs can add to significant reductions in costs associated with SIMM testing in a manufacturing environment. This advantage becomes even greater when the trend for larger capacity SIMMs is taken into account.

For example, because four SIMM slots on a CPU board in the present invention can support the testing of thirty-two SIMMs, and eight SIMM slots on a CPU board support testing of only eight SIMMs in a conventional SIMM testing system, the present invention reduces test time per SIMM. Accordingly, in the embodiment shown in FIG. 2B, test time per SIMM is reduced by a factor of approximately one half due to a reduction in the number of SIMM slots on a CPU board used to effect SIMM testing, and is further reduced by approximately a factor of four due to the fourfold increase in the number of SIMMs tested.

Although gangSIMM PWA 201 includes eight SIMM slots, alternative embodiments may include a greater or lesser number of slots that respectively increase or decrease the testing capacity of the SIMM testing system of the present invention.

Figure 2C:
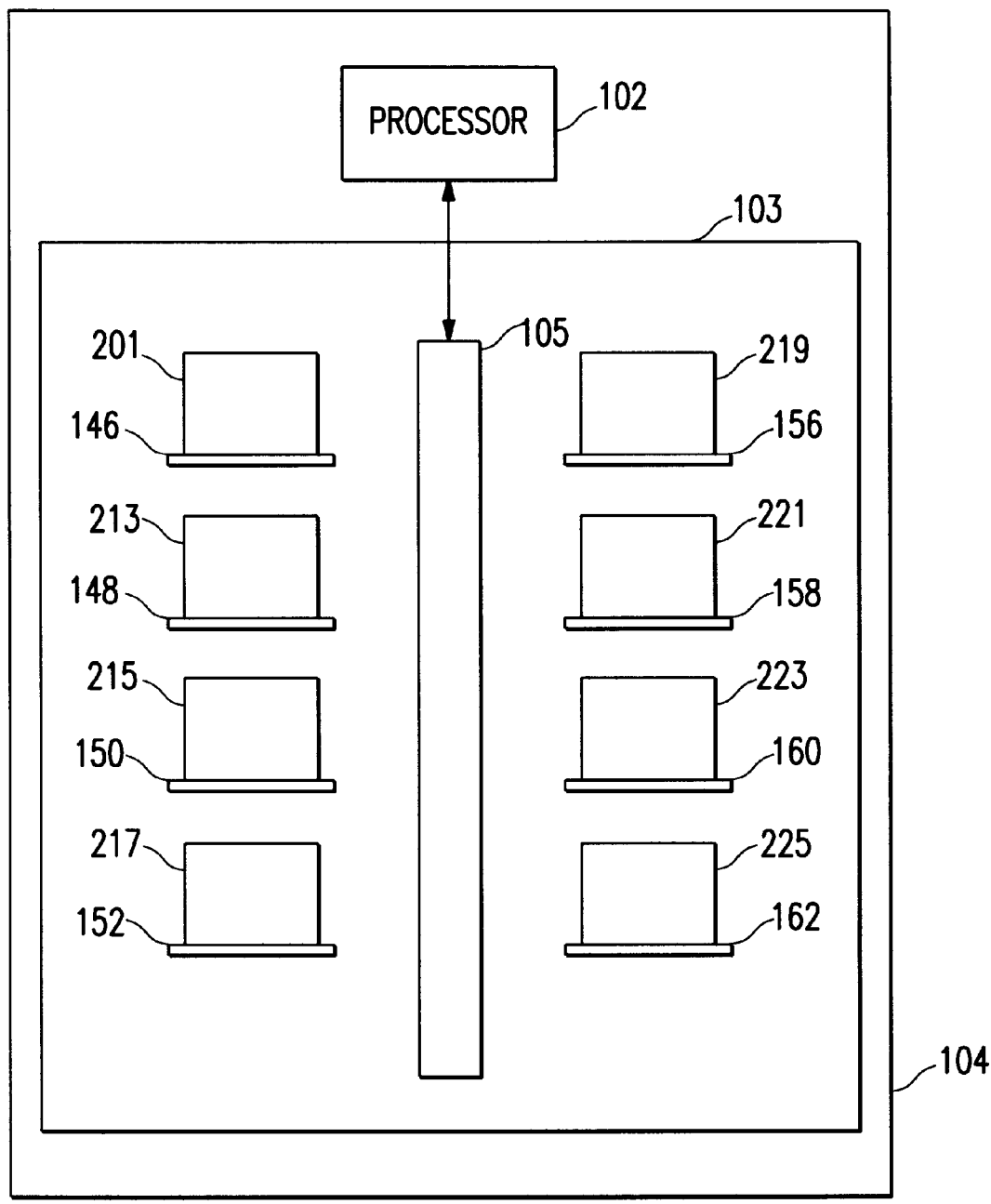
FIG. 2C shows a diagram of a separate gangSIMM PWA plugged into each SIMM slot of a CPU board.

Referring next to FIG. 2C, eight gangSIMM PWAs directly inserted into SIMM slots of CPU circuit board 104 may be appreciated. In particular, the described embodiment of FIG. 2C shows gangSIMM PWAs (201, 213, 215, 217, 219, 221, 223 and 225) inserted into respective slots (146, 148, 150, 152, 156, 158, 160 and 162) in memory 103. It will be appreciated that if each gangSIMM PWA includes eight SIMM slots, the example embodiment shown in FIG. 2C is capable of testing sixty-four SIMMs in parallel. Hence, one of ordinary skill in the art will recognize the significant testing capacity gains of the present invention in comparison to conventional SIMM testing systems. Conventional SIMM testing systems typically support parallel testing of not more than eight SIMMs. Accordingly, such advantages include but are not limited to gains in testing efficiency, lowering of per SIMM testing time and costs, and increased computer production output.

It will be appreciated that one or more gangSIMM PWAs may be coupled together where the edge connector of one gangSIMM PWA plugs into a SIMM slot of another gangSIMM PWA. It will also be appreciated that the coupling of gangSIMM PWAs provides increased capacity to test SIMMs in parallel.

Figure 3A:
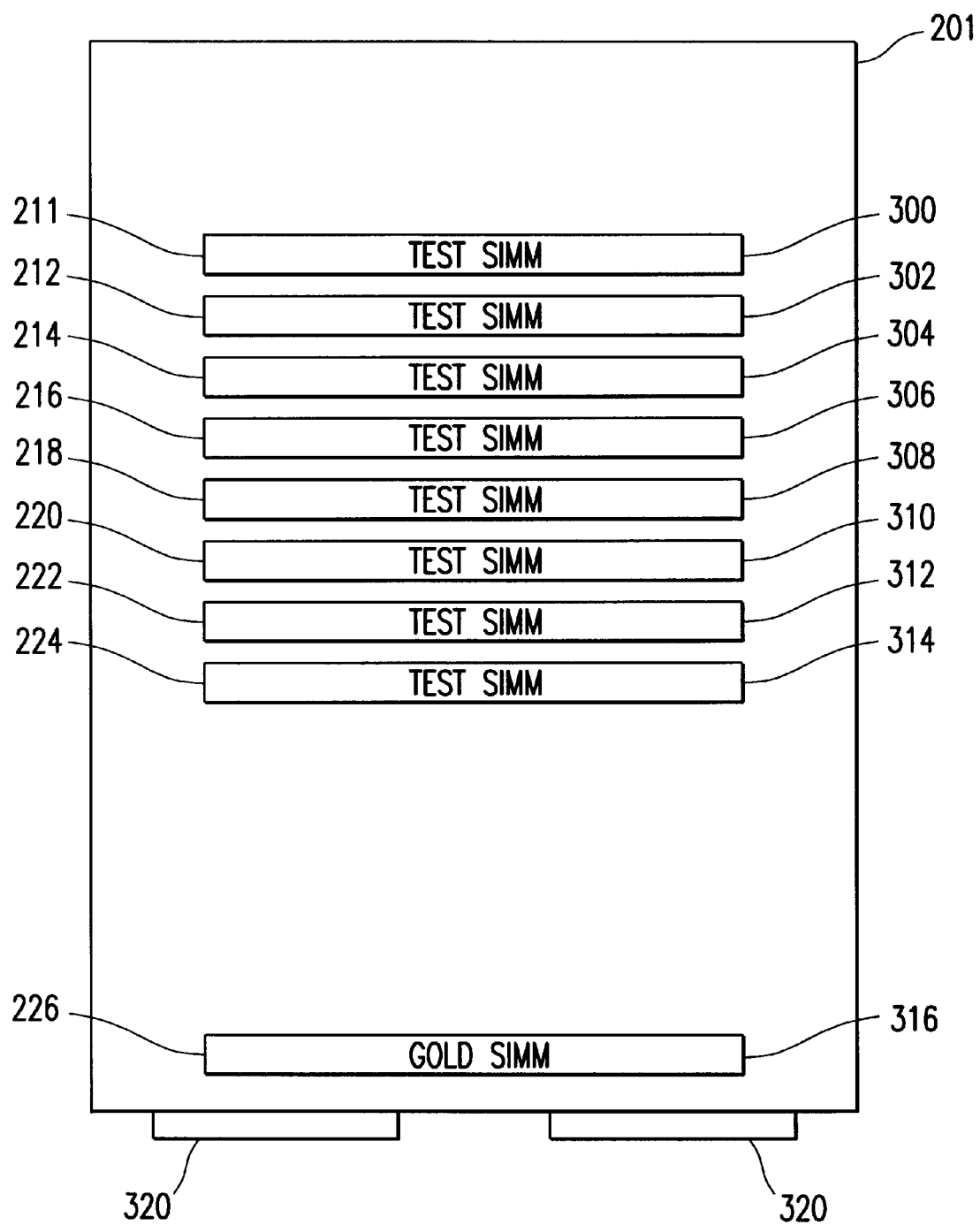
FIG. 3A shows a diagram of the gangSIMM PWA of FIGS. 2A–2D that includes eight test SIMMs and one Gold SIMM.

Referring next to FIG. 3A, a diagram of a gangSIMM PWA 201 may be appreciated. As shown, gangSIMM PWA 201 includes eight test SIMMs including (300, 302, 304, 306, 308, 310, 312, 314) and a gold SIMM 316 plugged into respective SIMM slots (211, 212, 214, 216, 218, 220, 222, 224, and 226). GangSIMM PWA 201 also includes an edge connector 320 that is compatible for direct insertion into a SIMM slot of a conventional CPU board. Furthermore, edge connector 320 is compatible for insertion into a SIMM slot of another gangSIMM PWA. It will be appreciated that such compatibility increases the universal application of the gangSIMM PWA and increases the SIMM testing capacity for each SIMM slot included within a CPU board.

The location of gold SIMM slot 226 is close to the gangSIMM Tester's 201 edge connector 320 to ensure signal integrity from memory bus 105. The address, data, and control signals from memory bus 105 that are received by gold SIMM 316 are buffered and fan out in parallel, as discussed below with regard to FIG. 4, to the eight test SIMMS (300, 302, 304, 306, 308, 310, 312, and 314) of gangSIMM memory tester 201.

Gold SIMM 316 establishes the standard for parallel testing SIMMs (300, 302, 304, 306, 308, 310, 312, 314) of the gangSIMM PWA 201. In order to establish a SIMM as gold SIMM 316, a SIMM is tested several times to ensure that the SIMM is good. If the SIMM passes each of the tests without failures, glitches or questions, then the SIMM can be used as gold SIMM 316. If gold SIMM 315 fails during testing of the gangSIMM PWA, each SIMM will fail, and will alert the operator that gold SIMM 316 is bad.

Figure 4:
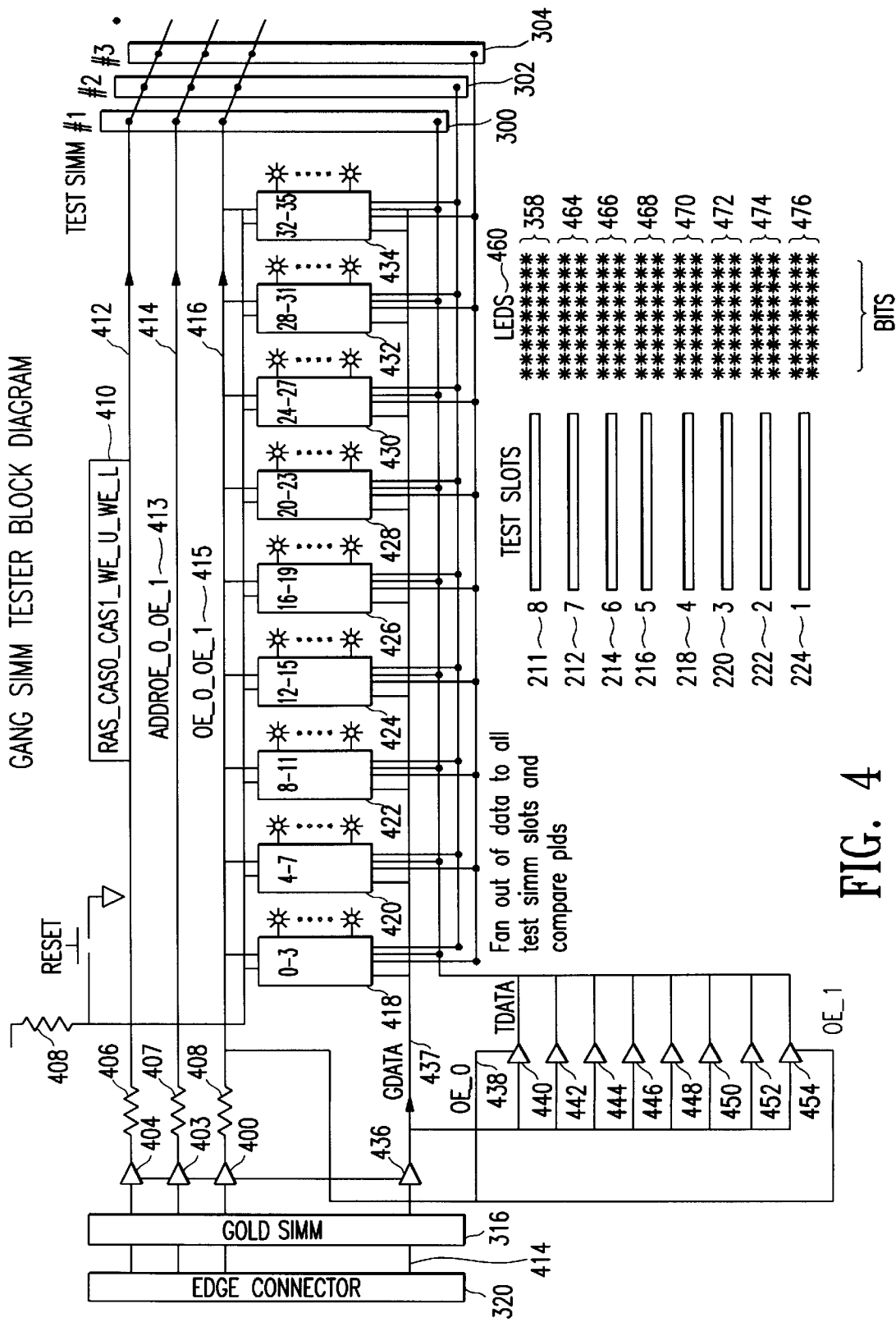
FIG. 4 shows a detailed block diagram of the gangSIMM PWA of FIG. 3 in accordance with the present invention.

More particularly, gangSIMM Tester PWA 201 along edge connector 320 plugs into a single CPU SIMM slot, such as SIMM slot 146. During the execution of memory diagnostics by conventional test suite such as test suite 109, gold SIMM 316 completes all read and write operations of the test addressed to the CPU SIMM slot 146. The same data received by gold SIMM 316 is distributed in parallel to test SIMMS (300, 302, 304, 306, 308, 310, 312 and 314). The data read from each test SIMM is compared to the data read from gold SIMM 316. If a difference between the data is detected, the offending test SIMM is flagged via LEDs. As shown in FIG. 4, the SIMMS are isolated from memory bus 105 via buffers so that the memory diagnostics will continue to execute through the full range of testing to completion for each test SIMM. Subsequent failures will be flagged as each is encountered. By comparing data on a bit by bit basis, the gangSIMM PWA tester 201 can detect and identify the specific bad DRAM of a failed test SIMM.

Figure 3B:
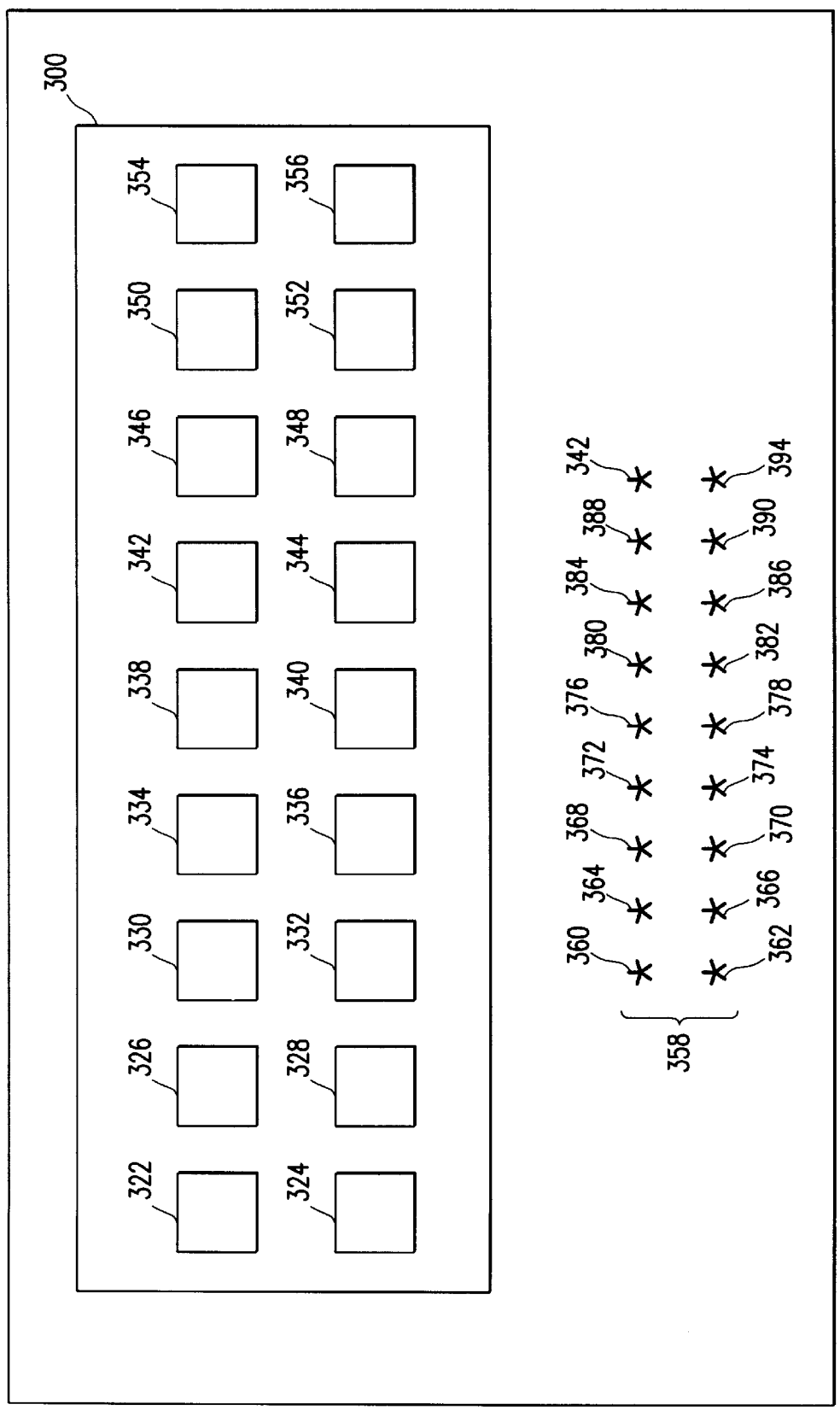
FIG. 3B shows a diagram of a SIMM and corresponding LEDs of the gangSIMM PWA of FIG. 3A.

Referring next to FIG. 3B, an exemplary test SIMM 300 and a corresponding set of LEDs of the gangSIMM PWA 201 may be generally appreciated. One or ordinary skill in the art will recognize that one SIMM is shown in FIG. 3B for exemplary purposes, and that a test suite applied to the gangSIMM PWA 201 can directly test N number of test SIMMs. Similarly, only one set of LEDs 358 is shown for exemplary purposes. In a preferred embodiment, gangSIMM PWA 201 would include 8 SIMMs that correspond to 8 sets of LEDs. As shown in FIG. 3B, SIMM 300 preferably includes 18 memory units such as DRAMS. Test Simm 300 has a corresponding 2×9 block of miniature LEDs, where each DRAM corresponds to an individual LED. It will be appreciated that the number of DRAMS may differ depending upon the system requirements and configuration of the test SIMMs.

During testing of SIMM 300, comparator logic of the gangSIMM PWA 201 that is discussed in greater detail below with regard to FIG. 4 and FIG. 5 uses a latched address if a SIMM fails to translate which DRAM had erroneous data. Once detected, the individual LED representing the particular DRAM is set so that it identifies the failed DRAM. For example, if during SIMM testing, DRAMs 322 and 324 were detected as having incorrect data, corresponding LEDs 360 and 362 would be set. It will be appreciated that the configuration of the DRAMs and LEDs is provided only for illustrative purposes, and that the present invention will support alternative gangSIMM PWA 201 configurations. Once one or more LEDs are set, for example LEDs 360 and 362, each set LED will remain on throughout the full test suite so that at completion of the test a cumulative collection of LEDs corresponding to failed DRAMs will be displayed. Upon test reset, the LEDs are cleared and the next test cycle can begin.

Figure 1:
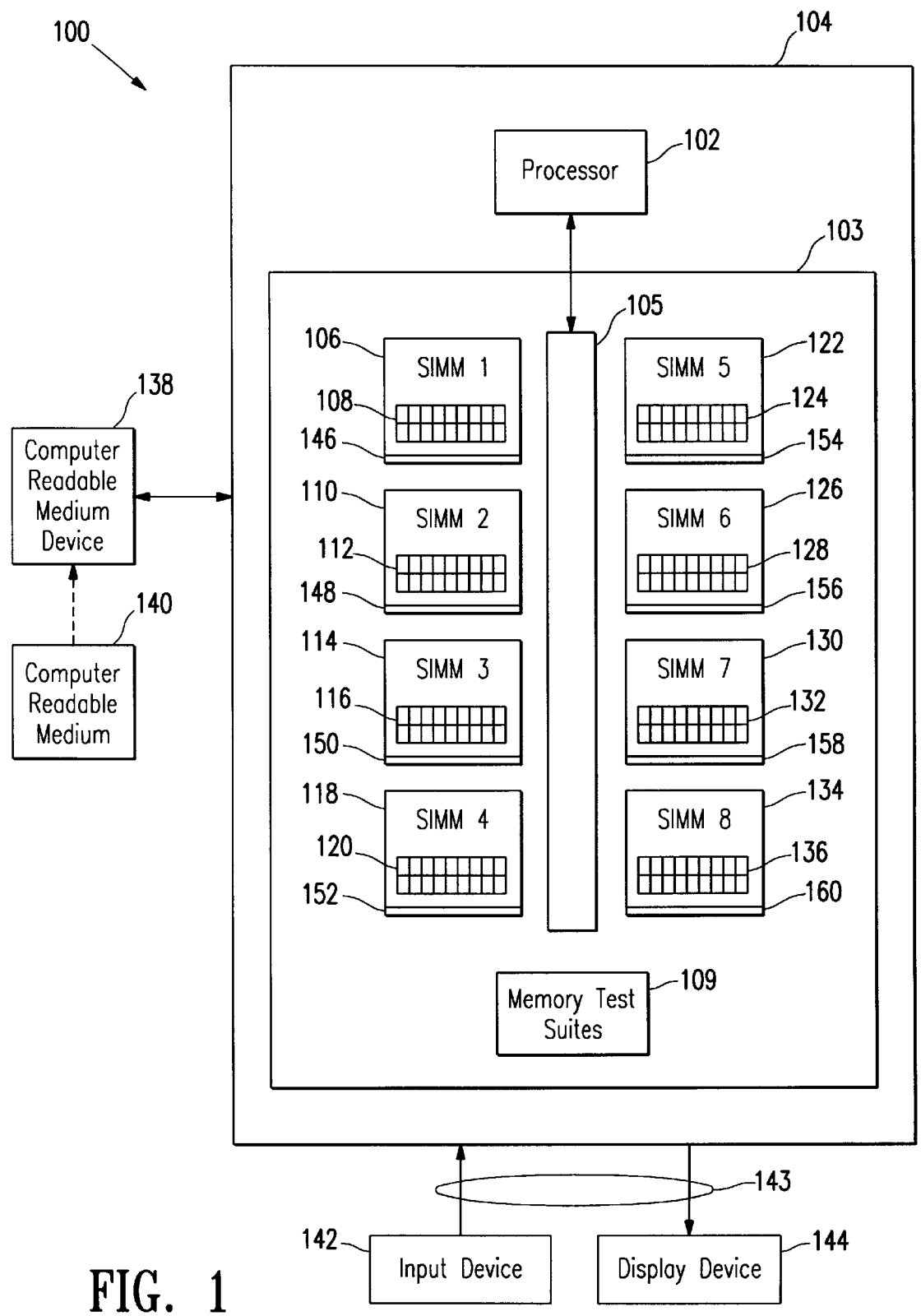
FIG. 1 shows a diagram of a computer system with a conventional SIMM configuration.

Referring next to FIG. 4, a detailed block diagram including gold SIMM 316 and test SIMMs 300, 302 and 304 of gangSIMM PWA tester 201 may be generally appreciated. Although three test SIMMs are shown, one of ordinary skill in the art will recognize that the block diagram described below applies to each of the test SIMMs of gangSIMM PWA tester 201. Hereafter, exemplary SIMM 300 will be used to describe the function of each SIMM. As shown, gangSIMM PWA tester 201 includes an edge connector 320 used to plug the gangSIMM PWA 201 directly into a SIMM slot. The memory bus 105 of CPU board 104, as shown in FIG. 1, connects directly into the SIMM slot through edge connector 320 and extends via busses 412, 414 and 416 to gold SIMM 316. Data, addresses and control signals are transmitted over busses 412, 414 and 416. Example control signals 410 are shown along busses 412 and 416, and example address 413 is shown along buss 414. Example signals RAS and CASx are conventional signals a CPU uses for writing and reading data to conventional SIMMs. These signals are similarly used in gangSIMM PWA 201 to read and write data to gold SIMM 316. Example signals WE.U and WE.1 are other standard signals the gangSIMM PWA 201 uses to read and write data to the gold SIMM 316 and to test SIMMS such as 211, 212, 214, 216, 218, 220, 220, 222, 224 and 226. GangSIMM PWA 201 also includes program logic devices (PLDs) (418, 420, 422, 424, 426, 428, 430, 432 and 434) that are comparators which compare data from gold SIMM 302 to data from each test SIMM, such as test SIMM 300.

Since busses 412, 414 and 416 extend from memory bus 105, communications to SIMM slots such as SIMM slot 146 on CPU board 104 occur directly with gold SIMM 316 of gangSIMM PWA 201. Hence, all communications from CPU board 104 including reads, writes, etc., are directed to gold SIMM 316. Buffers 400, 402, and 404 buffer gold SIMM 316 from signals originating from other portions of gangSIMM PWA 201. Accordingly, one of ordinary skill in the art will recognize that buffering with buffers 400, 402, and 404 will allow signals to proceed from gold SIMM 316 to other portions of gangSIMM PWA 201, but will prevent signals from other portions of gangSIMM PWA 201 to proceed through each buffer to reach gold SIMM 316.

Busses 412, 414, and 416 continue through respective buffers 404, 402 and 400, and respective resisters 406, 407 and 408 to test SIMM 300. Accordingly, control signals from the CPU board 104 fan out in parallel to the test SIMMS, such as test SIMM 301. The Gang SIMM Tester Block 201 further includes buses GDATA 437 and TDATA 438. GDATA bus 437 carries gold data during the gang-SIMM memory test. TDATA bus 438 carries gold SIMM data during the initialization of test SIMM 301, and carries test SIMM data during the subsequent read and comparison of the gold SIMM 302 and test SIMM 301 data.

As shown in FIG. 4, buffer 436 directs gold data provided by gold SIMM 302 over bus GDATA 437 downward to TDATA buffers (440, 442, 444, 446, 448, 450, 452 and 454). Each TDATA buffer buffers signals and data to a specific test SIMM, such as test SIMM 300 of gangSIMM tester 201. It will be appreciated that each buffer when enabled allows gold data on GDATA bus 437 to send gold data onto TDATA bus 438 in parallel to a specific test SIMM, such as test SIMM 300. It will be further appreciated that each buffer when disabled prevents gold data provided over bus GDATA 437 to send data onto TDATA bus 438 to each test SIMM.

GDATA bus 437 carries gold SIMM data and TDATA bus 438 carries test SIMM data to PLDs (418, 420, 422,424, 426, 428, 430, 432, and 434). For each test SIMM, each PLD compares a four bit data pocket of gold SIMM data to test SIMM data. More particularly, PLDs (418,420, 422, 424, 426, 428, 430, 432 and 434) test four bit data packets (0–3, 4–7, 8–11, 12–15, 16–19, 20–23, 24–27, 28–31, and 32–35) from each SIMM. Each four bit data packet is read from one DRAM of a SIMM. If there are 9 DRAMs on each SIMM, then the complement of PLDs test a total of 32 data bits and 4 parity bits. Since each DRAM is 4 bits wide, each PLD in performing the comparative data test is capable of flagging which DRAM is failing by identifying the 4-bit DRAM that includes the erroneous bit. It will also be appreciated that DRAMS are provided as an example of memory type and that other types of memory such as EDO, synchronous DRAMS, etc. could be similarly tested by the present invention. It will be further appreciated that the SIMMS may include different numbers of DRAMS identifiable by a data bit address of a length other than two bits.

It will be appreciated that FIG. 4 shows that gangSIMM PWA 201 includes 9 PLDs to test 18 DRAM of each test SIMM. In order to accomodate more DRAMs than PLDs, 9 DRAM are first tested for a few clock cycles and the other 9 DRAM are test for the next few clock cycles. One of ordinary skill in the art will recognize that each implementation of the present invention will initially define the number of clock cycles between testing each row of DRAMs. It will also be appreciated that if there are not more DRAMS than PLDs, switching between each row of DRAMs for testing will not be necessary.

In order to display a failed SIMM identified by a PLD, an LED corresponding to each DRAM is included on gang-SIMM PWA 201. Accordingly, since each SIMM of the gangSIMM PWA 201 preferably includes 18 DRAMS, then 18 LEDS (2 rows of 9 LEDS) are provided for each SIMM slot. LED sets 358, 464, 466, 468, 470, 472, 474 and 476 are provided to identify one or more bad DRAMS of SIMMs plugged into respective SIMM slots (211, 212, 214, 216, 218, 220, 222 and 224). Therefore, if a comparison of gold and test data performed by a PLD identifies a bad DRAM, a specific LED of an LED set corresponding the DRAM is set. For example, if a data compare performed by PLD 434 identifies the 17th DRAM of test SIMM slot 211 for test SIMM 300 as bad, the top rightmost LED of LED set 358 is set.

It will be appreciated that identified error of DRAMs are latched through the remainder of SIMM testing. Therefore, the corresponding LED identifying the DRAM in error will remain on through the rest of the memory tests. It will be further appreciated that if a DRAM is identified as bad, the gangSIMM PWA tester 201 will continue to test the remaining DRAM of the SIMMs plugged into the SIMM slots. One of ordinary skill in the art will further recognize that other embodiments of the present invention may include SIMMs that support a different number of DRAMS, and therefore will include a correspondingly different number of LEDs. Accordingly, one of ordinary skill in the art will recognize the gains in efficiency and cost effectiveness due to the ability of the gangSIMM PWA tester 201 to identify the specific bad memory units.

Figure 5A:
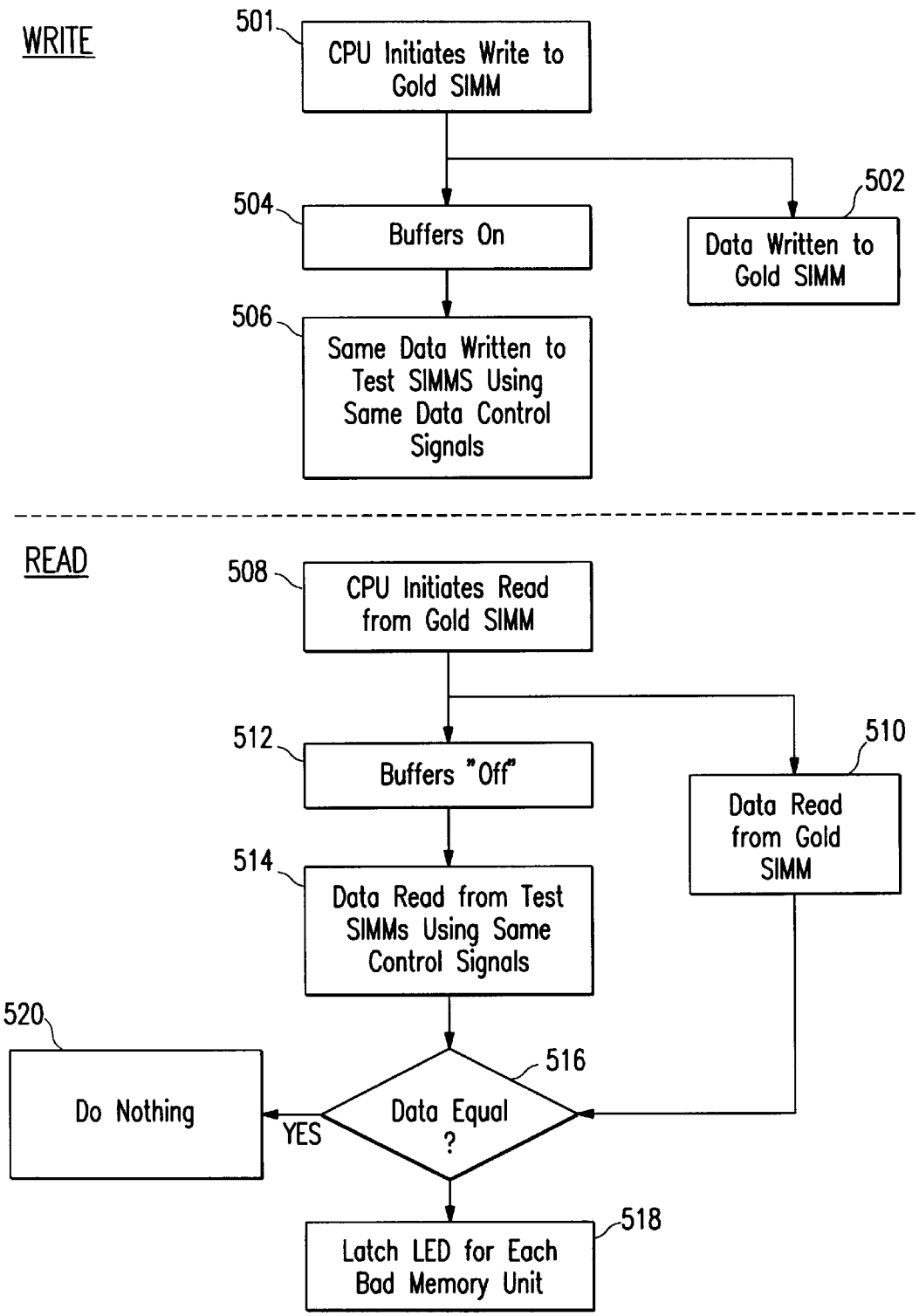
FIG. 5A shows a flowchart of a method of performing gangSIMM memory testing in accordance with the present invention.

Referring next to FIG. 5A, a flowchart of performing gangSIMM memory testing 500 of the present invention may be generally appreciated. As shown, the method of performing gangSIMM memory testing 500 begins in step 501 with processor 102 initiating the writing of data to gold SIMM 316. More particularly, CPU 102 sends data via memory bus 105 to active SIMM slots on CPU board 104. If edge connector 320 of the gangSIMM PWA tester 201 is plugged into SIMM slot 146, it is an active SIMM slot. The data provided by CPU 102 continues unabated through edge connector 320 via GDATA data bus 437. In step 502, the data is written to gold SIMM 316.

In order to test the test SIMMs, gangSIMM PWA tester 201 compares like data written to the gold SIMM and each test SIMM. Therefore, as shown in FIG. 4, data written to gold SIMM 211 is also distributed in parallel and written to each test SIMM plugged into test SIMM slots (211, 212, 214, 216, 218, 220, 222 and 224) of the gangSIMM PWA tester 201. Hence, in step 504, the first set of buffers are "on" so that data written to gold SIMM 302, hereinafter referred to as gold data, is routed to GDATA bus 437 to be distributed in parallel to each test SIMM. More particularly, FIG. 4 shows that after gold data is written to gold SIMM 302, the data is routed along GDATA bus 437 and passes through buffer 436. Next, the gold data continues downward toward buffers (440, 442, 444, 446, 448, 450, 452, and 454), where each buffer buffers data to a respective test SIMM slot (211, 212, 214, 216, 218, 220, 222 and 224). One of ordinary skill in the art will recognize that when each buffer in step 504 is on the gold data will be routed via each buffer to a unique branch of TDATA bus 438. Once through each buffer, each branch of TDATA bus 438 routes gold data in parallel to each test SIMM. In step 506, CPU 102 writes gold data to each SIMM plugged into test SIMM slots (211, 212, 214, 216, 218, 220, 222, and 224).

Once CPU 102 writes like data to gold SIMM 316 and each test SIMM, the process begins to read and compare data from gold SIMM 316 to data from each test SIMM, such as Test SIMM 300 shown in FIG. 4. In step 508, CPU 102 initiates the reading of data from gold SIMM 316. In step 510, the data is read from gold SIMM 316. In step 512, before reading data from each test SIMM, buffers (440, 442, 444, 446, 448, 450, 452, and 454) are "off." One of ordinary skill in the art will recognize that if the buffers are "off," gold data from GDATA bus 437 will be prevented from entering TDATA bus 438. Once the buffers are "off" in step 514, CPU 102 reads the test data from each test SIMM using the same control signals that were used to read the gold data from gold SIMM 316.

One of ordinary skill in the art will further recognize that it is necessary to compare gold and test data at determinate points in time when GDATA bus 437 and TDATA bus 438 have valid comparable gold and test data. In order to compare data at determinate point, the PLDs compare data according to a clocked signal. Thus, CPU 102 sends an output enable (OE) signal and a data address to gold SIMM 316 and in parallel to each of the test SIMMs, such as Test SIMM 300. In response, in step 510 data is read at each SIMM so that gold SIMM 316 places gold data onto GDATA bus 437, and each test SIMM such as test SIMM 300 in step 514 places test data on TDATA bus 438.

A few nanoseconds after the SIMMs place gold data and test data on respective buses GDATA bus 437 and TDATA bus 438, CPU 102 in step 514 provides a subsequent output enable signal that triggers PLDs (418, 420, 422, 424, 426, 428, 430, 432, and 434) in step 516 to compare the test and gold data.

Figure 5B:
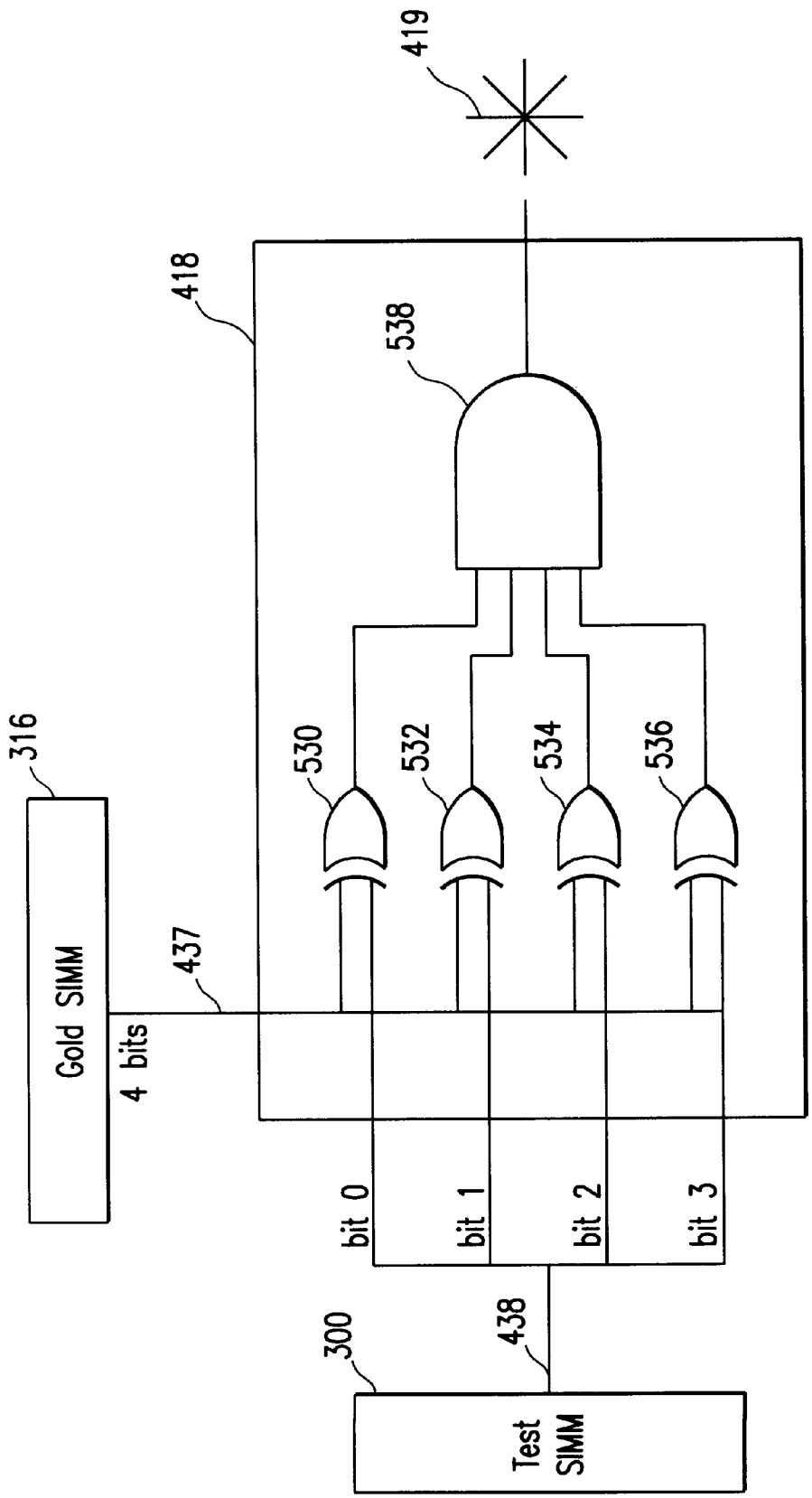
FIG. 5B shows a detailed diagram of a PLD of FIG. 4.

FIG. 5B shows a detailed diagram of the circuit used to compare test and gold data. As shown, exemplary PLD 418 receives a four bit data packet from test SIMM 300 and a four bit data packet from gold SIMM 316. Separate pins for each bit enable PLD 418 to perform a bit to bit comparison of gold and test data. PLD 318 uses "exclusive or" gates 530, 532, 534 and 536 to compare each corresponding bit of gold and test data. The "high or low" results are then input into an "and" gate 538 to determine whether the gold and test data are equal. Now returning to FIG. 5A, if in step 516 the data is equal then in step 520 nothing occurs. If the data is not equal, thereby indicating a failed DRAM, then in step 518 latch the error onto the corresponding LED, such as exemplary LED 490 of FIG. 5B.

The steps of the gangSIMM memory testing method 500 will continue to cycle until the execution of exemplary test suite terminates.

Once a test SIMM such as test SIMM 300 fails, the gangSIMM memory test, in step 518, latches the error so that the LED corresponding to the specific DRAM remains set through the remaining portion of the tests. Hence, if a series of tests are run against that failed SIMM, the LED will remain on through each subsequent test. The LED will only clear once the fixture including the gangSIMM PWA 201 and CPU 102 are powered down. Once the fixture is subsequently powered on, the LEDs return to the default reset condition of "off." One of ordinary skill in the art will recognize that it is particularly important to latch error onto the LED, since a SIMM module is classified as bad whether the SIMM fails once or multiple times.

It will be appreciated that to increase test coverage a range of voltages (e.g., ±5%) may be applied to the SIMMs of the gangSIMM PWA 201. By applying a range of voltages the SIMMs are tested under different electrical operating environments. Each PLD on the gangSIMM PWA 201 is programmed to monitor the address bus waiting for the right address (a unique collection of 1's and 0's) to appear. This address is programmed to be any legitimate address that CPU 102 can normally write to. Once the unique address appears, each PLD captures the data on data bus 105 at that instance. The specific data address will determine whether the PLD margins the voltage to high, nominal, or low. One of ordinary skill in the art will recognize that a manual switch operated by a technician could also be used to control the margining of voltage to high, low or nominal.

Figure 6:
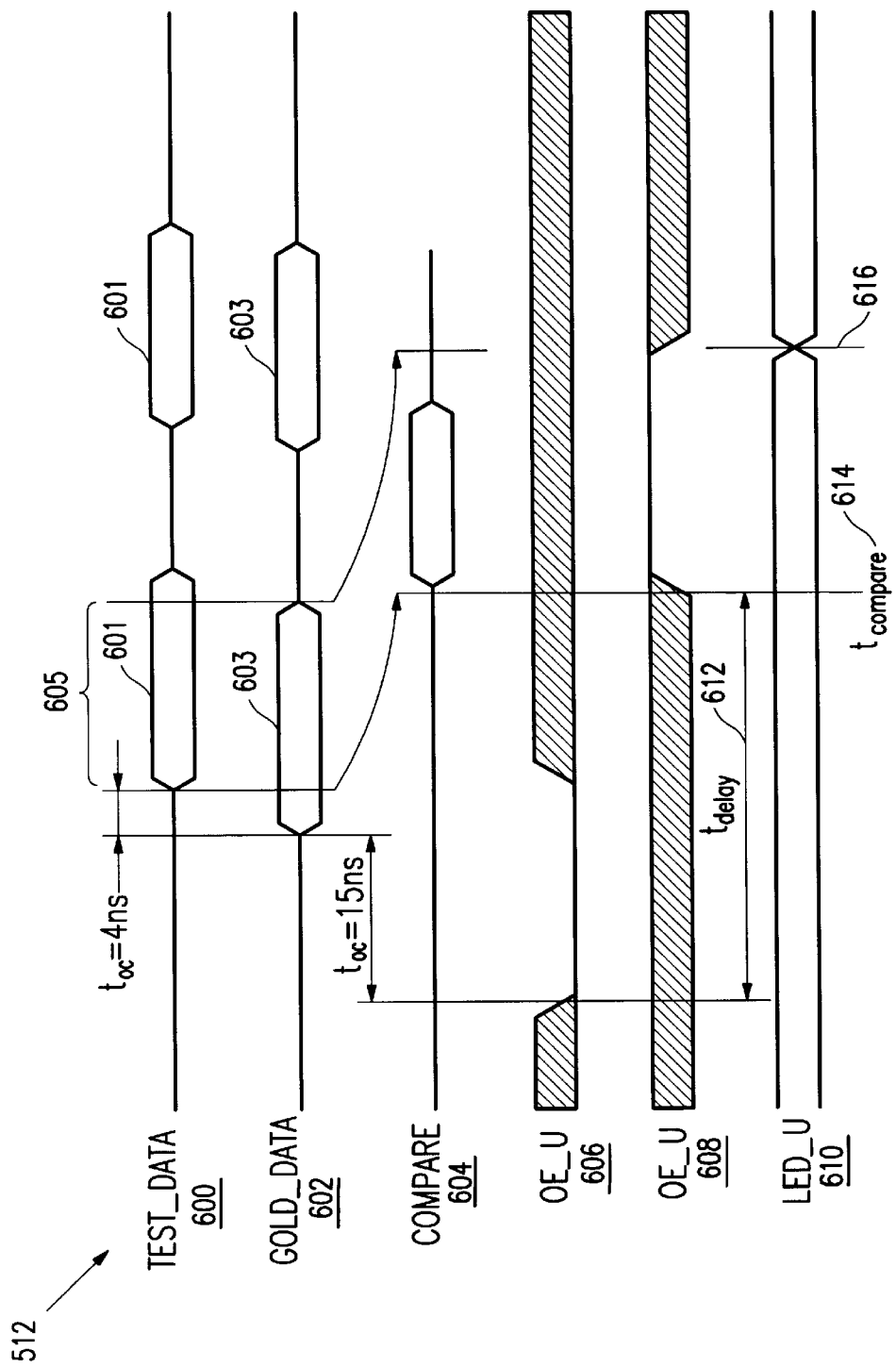
FIG. 6 shows a detailed diagram of data compare step 512 of FIG. 5.

Referring next to FIG. 6, a diagram of data comparison step 512 of FIG. 5 may be appreciated in greater detail. More particularly, FIG. 6 shows the time sequence of placing gold and test data on respective buses, GDATA bus 437 and TDATA bus 438, and the subsequent comparison performed by each PLD at a determinate point in time. To begin, test_data line 600 shows test data 601 placed on TDATA bus 438 in response to an output enable signal shown at line OE_U 606. Gold_data line 602 shows gold data 603 placed on GDATA bus 437 in response to the output enable signal shown at line OE_U 606. It will be appreciated that due to a number of factors, such as skew in the signals and the circuit specific to each bus that provides the initial signal, gold and test data, respectively 603 and 601, are not placed on each respective bus GDATA bus 437 and TDATA bus 438 at exactly the same point in time. Accordingly, in order to perform a valid data compare both signals must be similarly high or low.

As shown in FIG. 6, time frame 605 represents the time at which test data 601 is simultaneously on TDATA bus 438 as gold data 603 is on GDATA bus 437. More particularly, test_data line 600 shows a 19 nanosecond delay from the output enable signal until the test data is on TDATA bus 438, and gold_data line 602 shows a 15 nanosecond delay from the output enable signal until gold data 603 is on GDATA bus 437. Hence, the PLDs compare the data during time frame 605.

In order to trigger the compare process, line output enable (OE_U) 606 shows the output enable signal going low. When the output enable signal goes low, both gold SIMM 302 and each of the Test SIMMs, such as Test SIMM 304 are signaled to place data at a specified address on respective bus GDATA bus 437 and TDATA bus 438. As discussed above, there is a 15 nanosecond delay for Gold SIMM 302 to receive that signal, react and read information at the requested address from memory, (e.g., DRAMS), and place the retrieved gold data 603 onto GDATA bus 437. Exemplary test SIMM 300 also receives that same signal. However, there is an additional 4 nanosecond delay for test SIMM 300, because there are an additional series of buffers that test SIMM 300 must contend with. Since gold data 603 and test data 601 are not synchronously placed on respective buses GDATA bus 437 and TDATA bus 438, it is necessary to compare data at a determinative window of time 605 when gold data 603 and test data 601 are available on a respective buses GDATA bus 437 and TDATA bus 438.

CPU 102 provides a signal to enable PLDs (418, 420, 422, 424, 426, 428, 430, 432, and 434) to compare gold data 603 and test data 601. More particularly, in Output Enable U' line 608, CPU 102 provides an inverted output enable signal after a time delay ('delay) 612 to trigger each PLD to compare gold data 603 and test data 601. Accordingly, output enable U' goes high at 'compare 614, thereby enabling the PLDs, shown at compare line 604, to compare gold data 603 and test data 601. At line LED_U 610, a PLD identifies a difference between gold data 603 and test data 601, the LED is latched to on at 616.

It can therefore be appreciated that a new and novel SIMM memory testing system process and text fixture has been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims and equivalents thereof.

What is claimed is:

1. A gangSIMM memory device for testing a plurality of SIMMs in parallel, the device comprising:
    a plurality of SIMM slots directly connected to a memory bus extending from a CPU;
    a plurality of gangSIMM memory tester PWAs where each one is inserted into one of the plurality of SIMM slots; and
    a plurality of SIMM slots where each one includes a SIMM mounted thereon is mounted upon each one of the plurality of gangSIMM memory tester PWAs, wherein a memory test performed by the CPU of a SIMM slot directly connected to the memory bus extends in parallel to the SIMM of each one of the SIMM slots where each one of the SIMM slots is mounted on one of the plurality of gangSIMM memory tester PWAs.

2. The gangSIMM memory device of claim 1, wherein each one of the plurality of gangSIMM PWA memory tester PWAs includes:
    a gold SIMM mounted on one of the plurality of SIMM slots, wherein the data of the gold SIMM is good.

3. The gangSIMM memory device of claim 2, wherein each one of the plurality of gangSIMM PWA memory tester PWAs includes:
    a plurality of test SIMMs where each one is mounted on a unique one of the plurality of SIMM slots, wherein the memory test performed by the CPU compares in parallel data of the gold SIMM to data of each one of the test SIMMs.

4. The gangSIMM memory device of claim 2, wherein the gold SIMM includes a plurality of memory units mounted thereon.

5. The gangSIMM memory device of claim 3, wherein each of the plurality of test SIMMs includes a plurality of memory units mounted thereon.

6. The gangSIMM memory device of claim 5 further including a plurality of indicators, wherein each one of the indicators corresponds to one of the plurality of memory units of each test SIMM, wherein if one of the SIMMs fails the memory test performed by the CPU LEDs the indicator corresponding to the failed memory unit of the SIMM is set.

7. The gangSIMM memory device of claim 6, wherein each of the plurality of indicators are LEDs.

8. The gangSIMM memory device of claim 5, wherein each of the plurality of memory units are DRAM.

9. The gangSIMM memory device of claim 5, wherein the plurality of memory units are selected from a group consisting of ERAM, EDO RAM, and synchronous DRAM.

10. The gangSIMM memory device of claim 1 further including a plurality of indicators, wherein each of the indicators corresponds to one of the plurality of SIMMs mounted on the gangSIMM memory tester PWA, wherein if one of the SIMMs fails the memory test performed by the CPU the indicator corresponding to the failed SIMM is set.

11. The gangSIMM memory device of claim 10, wherein each of the plurality of indicators are LEDs.

12. The gangSIMM memory device of claim 1 further including an additional gangSIMM memory tester PWA comprising a plurality of SIMM slots and a plurality of SIMMs corresponding each of the SIMM slots, wherein the additional gangSIMM memory tester PWA is inserted into one of the plurality of SIMM slots of the one of the plurality of gangSIMM memory tester PWAs, wherein the memory test performed by the CPU for testing the SIMM slot directly connected to the memory bus extends in parallel to each of the SIMM slots of the gangSIMM memory tester PWA and to each of the SIMM slots of the additional gangSIMM memory tester PWA.

13. A method of performing gangSIMM memory testing in parallel of a plurality of SIMMs where each is mounted to a corresponding SIMM slot of a gangSIMM memory tester PWA, wherein the method comprises the steps of:
    inserting a gangSIMM memory tester PWAs into a SIMM slot directly connected to a memory bus and with a SIMM mounted thereon; and
    performing a memory test of the SIMM of the SIMM slot, wherein the memory test extends in parallel to each SIMM slot of the gangSIMM PWA.

14. The method of claim 13, wherein the step of inserting, a plurality of gangSIMM memory tester PWA are each inserted into a unique SIMM slot directly connected to the memory bus and each with a SIMM mounted thereon.

15. The method of claim 13, wherein the step of performing further includes:
    writing data to a gold SIMM;
    enabling a plurality of buffers;
    writing data in parallel to a plurality of test SIMMs;
    disabling the plurality of buffers;
    sending a signal and address to read the data of the gold and test SIMMs; and
    comparing the data of the gold and test SIMMs in parallel, wherein if the test SIMM data is equal to gold SIMM data, the test SIMM is good, and wherein if the test SIMM data is not equal to the gold SIMM data, the test SIMM is bad.

16. The gangSIMM memory testing method of claim 15 further including:
    setting an indicator to identify the bad SIMMs, wherein the indicator remains set throughout the testing.

17. The gangSIMM memory testing method of claim 15, wherein the signal is an output enable signal.

18. The gangSIMM memory testing method of claim 16, wherein the step of setting an indicator identifies the bad memory units of the bad SIMMs.

19. The gangSIMM memory testing method of claim 16, where the indicator is an LED.

20. The gangSIMM memory testing method of claim 18, wherein the memory unit is a DRAM.

* * * * *